United States Patent
Converse

[19]

[11] Patent Number: 6,015,950
[45] Date of Patent: Jan. 18, 2000

[54] REFRACTIVE SPECTRUM SPLITTING PHOTOVOLTAIC CONCENTRATOR SYSTEM

[76] Inventor: Alexander K. Converse, P.O. Box 1349, Madison, Wis. 53701-1349

[21] Appl. No.: 08/855,405

[22] Filed: May 13, 1997

[51] Int. Cl.[7] .......................... H01L 31/052; H01M 6/36; H01J 3/14

[52] U.S. Cl. .......................... 136/246; 136/259; 136/261; 136/264; 136/248; 136/290; 126/683; 126/684; 126/698; 126/609; 126/628; 126/678; 250/216; 359/742; 359/558; 359/831; 359/574; 343/753; 429/111

[58] Field of Search ............................... 136/246, 259, 136/261, 264, 248, 290; 126/683, 684, 698, 609, 628, 678; 250/216; 359/742, 558, 831, 574; 343/753; 429/111

[56] References Cited

U.S. PATENT DOCUMENTS

| | | | |
|---|---|---|---|
| 2,949,498 | 8/1960 | Jackson . | |
| 4,021,267 | 5/1977 | Dettling | 136/246 |
| 4,204,881 | 5/1980 | McGrew | 136/246 |
| 4,844,598 | 7/1989 | Mori | 359/742 |

FOREIGN PATENT DOCUMENTS

WO 87/01512  3/1987  WIPO .
WO 91/04580  4/1991  WIPO .

OTHER PUBLICATIONS

Hu et al, Solar Cells From Basic to Advanced Systems, McGraw–Hill (month unknown), 1983.
P.G. Borden et al., "A 10–Unit Dichroic Filter Spectral Splitter Module," Proceedings of the Fifteenth IEEE Photovoltaic Specialists Conference, pp. 311–316 (1981) (month unknown).
J. Ludman et al., "Holograhpic Solar Concentrator for Terrestrial Photovoltaics," Proceedings of the Twenty–fourth IEEE Photovoltaic Specialists Conference, pp. 1208–1211 Dec. 1994.
A. K. Converse, "Refractive Spectrum Splitting Optics for Use With Photovoltaic Cells," Proceedings of the Twenty–fifth IEEE Photovoltaic Specialists Conference, pp. 1299–1302 May 1996.

*Primary Examiner*—Alan Diamond

[57] ABSTRACT

A solar energy conversion system, in which two separated arrays of refracting elements disperse incident sunlight and concentrate the sunlight onto solar energy converters, such that each converter receives a narrow portion of the broad solar spectrum and thereby operates at higher efficiency.

10 Claims, 2 Drawing Sheets

REFRACTIVE SPECTRUM SPLITTING PHOTOVOLTAIC CONCENTRATOR SYSTEM

FIELD OF THE INVENTION

This invention relates to solar energy conversion systems, particularly to the improvement of the efficiency of such systems by splitting the solar spectrum.

BACKGROUND OF THE INVENTION

In the conversion of solar energy to electricity by a semiconductor photovoltaic cell, incident photons free bound electrons, allowing the electrons to move across the photovoltaic cell. In this process, a photon having energy less than the photovoltaic material's band gap is not absorbed, while a photon having energy greater than the photovoltaic material's band gap only contributes the band gap energy to the electrical Output, and excess energy is lost as heat. Thus, a given photovoltaic cell operates most efficiently when exposed to a narrow spectrum of light whose energy lies just above the photovoltaic material's band gap.

To achieve higher solar energy conversion efficiency than can be obtained with a single photovoltaic material, a number of techniques have been developed to split the broad solar spectrum into narrow components and direct those components to appropriate photovoltaic cells.

In U.S. Pat. No. 2,949,498 to Jackson (1960), a solar energy converter is disclosed that splits the solar spectrum by stacking photovoltaic cells. A high band gap photovoltaic cell is placed in front of one or more photovoltaic cells having successively lower band gaps. High energy photons are absorbed by the first cell and lower energy photons are absorbed by the following cell. This method is disadvantageous in that the leading cells must be made transparent to the radiation intended for the following cells.

Borden et al., Proceedings of the Fifteenth IEEE Photovoltaic Specialists Conference, pp. 311–316 (1981), describes a design in which light is incident upon a dichroic filter that transmits high energy photons to a high band gap photovoltaic cell and reflects low energy photons to a low band gap cell. This method is disadvantageous in that a single dichroic filter yields only two spectral components, and an additional dichroic filter is needed for each additional desired spectral component.

Ludman et al., Proceedings of the Twenty-fourth IEEE Photovoltaic Specialists Conference, pp. 1208–1211 (1994), describes a design in which the spectrum is split by diffraction, and different photovoltaic cells are arranged to capture light of different wavelengths. A hologram serves as the diffraction grating and also concentrates the sunlight. This method is disadvantageous in that it is difficult to economically create durable diffraction gratings having high optical efficiency over a wide portion of the solar spectrum.

While refractive dispersion is a well known means of separating light into its spectral components, it is not trivial to create a refractive optical arrangement that is suitable for solar energy conversion. For example, refractive dispersion designs using only a single array of prisms or a concentrator with a single dispersing prism at or near its focus do not simultaneously provide adequate dispersion and concentration. U.S. Pat. No. 4,021,267 to Dettling discloses a spectrum splitting arrangement comprising concentrating, collimating, and refractive dispersing means. This method is disadvantageous in that the collimating optical element introduces additional transmission losses and alignment difficulties.

Notwithstanding the known problems and attempts to solve these problems, the art has not adequately responded to date with the introduction of a solar energy conversion system which improves efficiency by splitting the solar energy spectrum.

BRIEF SUMMARY OF THE INVENTION

The present invention is directed towards a solar energy conversion system that concentrates sunlight and refractively splits the solar spectrum into narrow components. In the present invention, sunlight passes sequentially through two separated arrays of refracting elements, which direct photons in different energy bands to appropriate solar energy converters, such as semiconductor photovoltaic cells having suitable band gaps. The present invention is generally advantageous in that concentration permits the use of a smaller quantity of relatively costly photovoltaic cells, and spectrum splitting allows those cells to operate at higher efficiency. Furthermore, the optical components may be economically manufactured of durable materials using methods known from Fresnel lens manufacture.

In comparison to splitting the solar spectrum by stacking photovoltaic cells, the present invention is advantageous in that the photovoltaic cells may be optimized for solar energy conversion without regard for their transparency. For example, the absorbing layers can be thick and the back electrical contact can be an opaque metal layer. In comparison to splitting with a dichroic filter, the present invention is advantageous in that the number of photovoltaic cells is not limited by the optical arrangement. In comparison to splitting by diffraction, the present invention is advantageous in that a broader portion of the solar spectrum may be practically directed to the Photovoltaic cells. In comparison to spitting by concentrating, collimating, and then dispersing sunlight, the present invention is advantageous in that fewer optical elements are required.

DETAILED DESCRIPTION OF THE INVENTION

Figure 1:
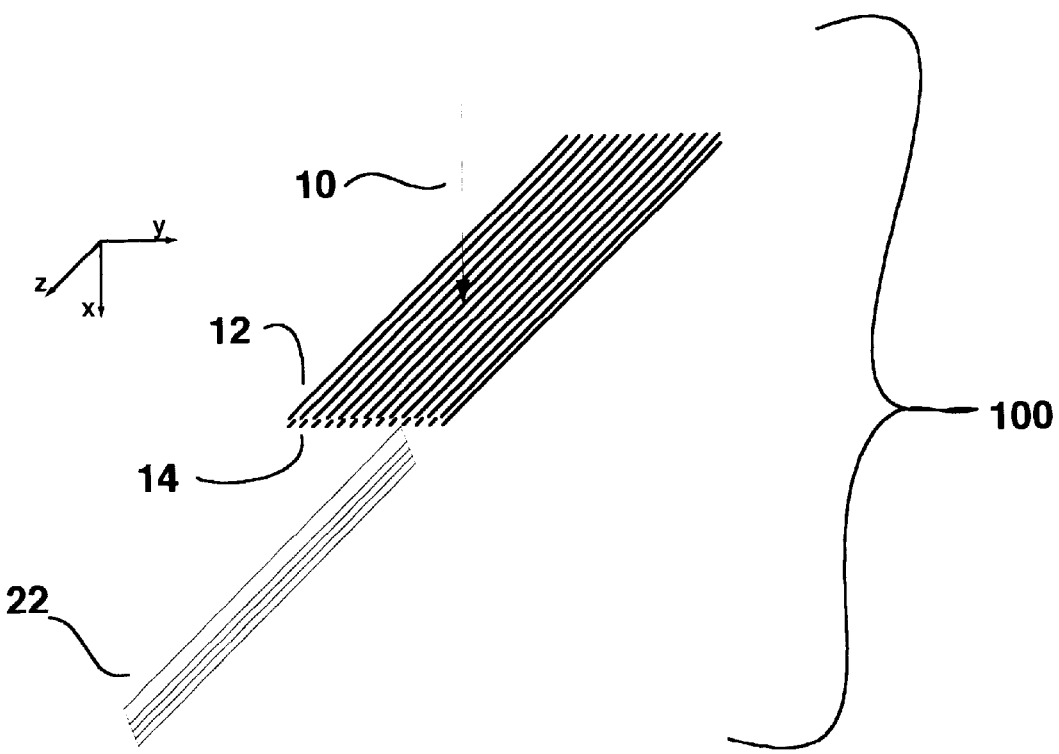
FIG. 1 is a perspective view of the preferred embodiment showing the parallel arrays of prisms and photovoltaic cells.
Figure 2:
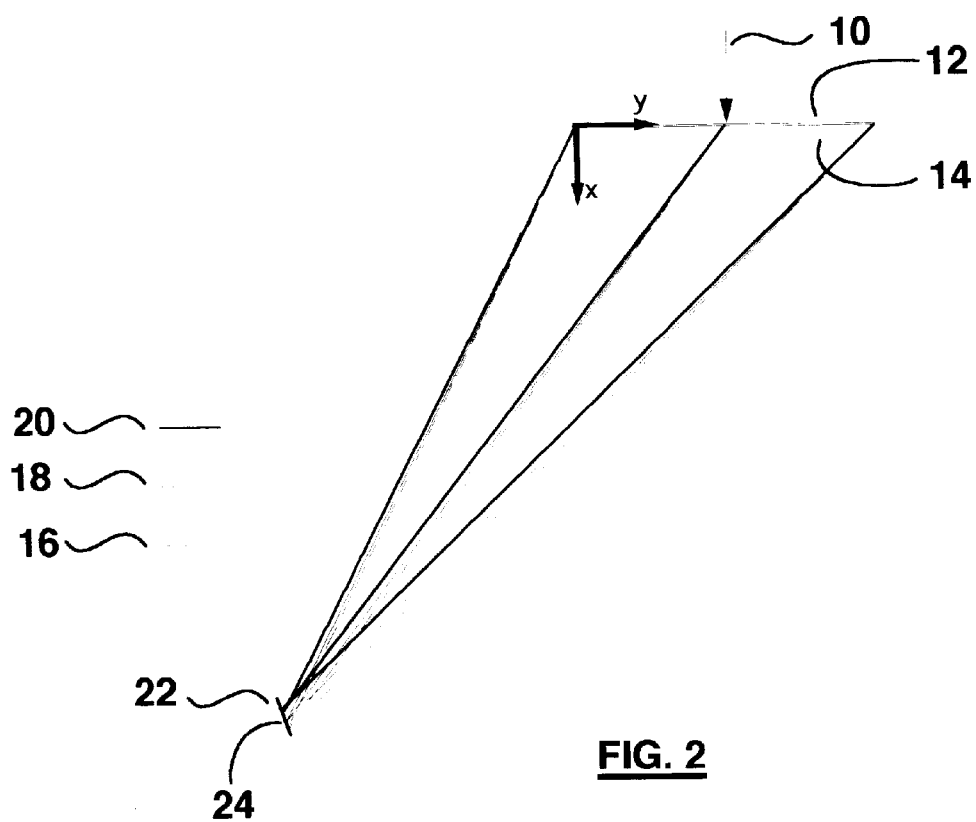
FIG. 2 is a transverse cross section of the preferred embodiment.
Figure 3:
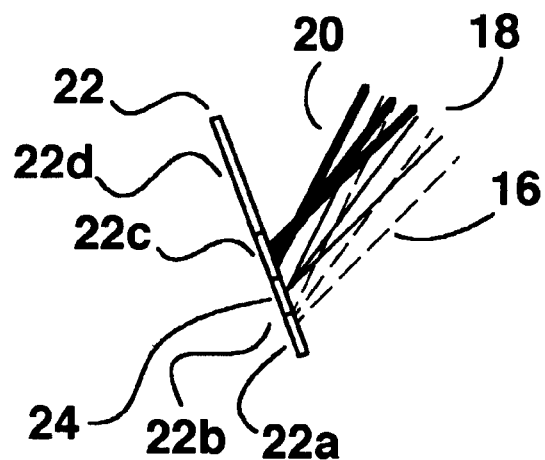
FIG. 3 is a detailed transverse cross section of the photovoltaic cells in the preferred embodiment.

Reference is initially made to FIG. 1, which depicts a device 100 that is an arrangement of refracting elements and solar energy converters in accordance with the present invention. Sunlight 10 first passes through a linear array of dispersing prisms 12 and then through a linear array of concentrating prisms 14, which direct the sunlight to regions of focus 22. Referring to FIG. 2, the dispersing prism and concentrating prism apex angles are preferably chosen to focus photons of a particular energy 18 onto a reference line 24. Hioher energy photons 20 tend to be refracted beyond the reference line while lower energy photons 16 tend to be refracted to the near side. Turning now to FIG. 3, solar energy converters are arranged in the regions of focus 22 so that photons in different energy bands fail on appropriate converters. The solar energy converters are preferably photovoltaic cells, suitably made from germanium, silicon, cadmium selenide, and cadmium sulfide, having band gaps of 0.7, 1.1, 1.7, and 2.4 eV, and located in regions of focus 22a, 22b, 22c, and 22d, respectively. The array of photovoltaic cells is 47 mm wide and tilted at 70° with respect to the y axis.

Figure 4:
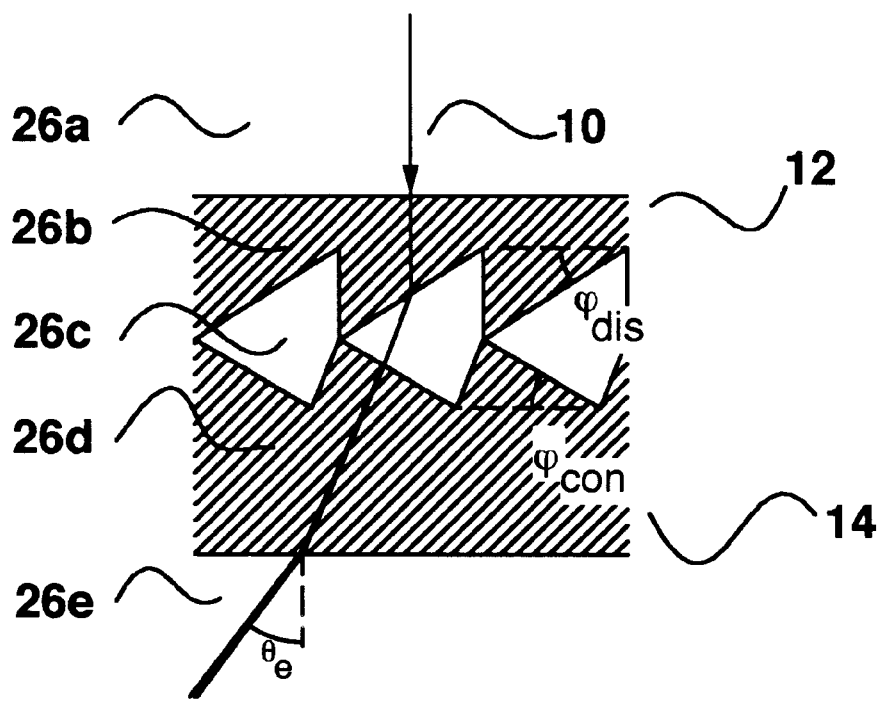
FIG. 4 is a detailed transverse cross section of the prisms in the preferred embodiment.

Referring finally to FIG. 4, the dispersing prism arrays 12 and the concentrating prism arrays 14 are 200 mm wide with 1 mm wide facets, suitably made of acrylic. A mounting arrangement, not shown in the figures, holds the prisms and photovoltaic cells fixed with respect to each other and tracks the sun so the prism arrays are preferably held normal to the incident sunlight. The prism arrays preferably lie next to one another in parallel planes for ease of mounting. The front surface of the dispersing prism array 12 and the back surface of the concentrating prism array 14 are preferably smooth for ease of manufacture; this also reduces the accumulation of dust or other debris on the front surface of the dispersing prism array.

Rays are traced through the prisms using Snell's law. The angle of a ray, measured from the x axis towards the y axis, is designated by $\theta_i$, where i=a, b, ..., e refers to the optical medium as labeled in FIG. 4: the air or vacuum 26a between the sun and the first prism array, the material 26b of which the first prism array is made, the air or vacuum 26c between the two prism arrays, the material 26d of which the second prism array is made, and the air or vacuum 26e between the second prism array and the regions of focus. The refraction of a ray at each boundary is given by $$a \rightarrow b \qquad \theta_b = \sin^{-1}(\sin(\theta_a)/n) \qquad (1)$$

$$b \rightarrow c \qquad \theta_c = \varphi_{dis} - \sin^{-1}(n\sin(\varphi_{dis} - \theta_b)) \qquad (2)$$

$$c \rightarrow d \qquad \theta_d = \sin^{-1}(\sin(\varphi_{con} + \theta_c)/n) - \varphi_{con} \qquad (3)$$

$$d \rightarrow e \qquad \theta_e = \sin^{-1}(n\sin\theta_d) \qquad (4)$$

where $\phi$dis and $\phi$con are the dispersing and concentrating prism apex angles, and n is the energy-dependent index of refraction of the optical material. Space outside the optical material is assumed to have index of refraction 1.

Applying Equations 1–4 in reverse order, the concentrating prism apex angles are chosen to focus 1.64 eV photons 18 from the center of the solar disk to the position (x,y)=(400 mm, −198 mm) 24; the resulting apex angles range from $\phi$con=5.1° at y=0 mm to $\phi$con=47.9° at y=200 mm. Because their apex angles vary, the concentrating prisms themselves introduce varying amounts of dispersion. To partially compensate for this, the dispersing prism apex angles vary linearly from $\phi$dis=35.0° at y=0 mm to $\phi$dis 30.0° at y=200 mm.

The present invention is further explained by the following example, which should not be construed by way of limiting the scope of the present invention. To simulate a device built following this design, a Monte Carlo computer code was developed. Rays of incident sunlight were randomly generated. Each ray was traced through the prisms, and its intercept with the photovoltaic array was determined. Each ray was weighted for its initial angle from the solar disk, for its location in the solar spectrum, and for reflection losses at the air-acrylic boundaries. In this two-dimensional approximation, incoming rays were projected onto the x-y plane. The electrical power output of a photovoltaic cell was calculated using a simple model, in which no photons with energy below the band gap are absorbed and all photons with energy above the band gap yield exactly the band gap energy. The calculated ideal photovoltaic efficiency of this refractive spectrum splitting system exceeded that of a system using one cell by 37%. However, the simulation predicted the refractive spectrum splitting system's optical efficiency (sunlight reaching photovoltaic cells versus direct sunlight reaching the concentrator) to be 10% below that of an ideal acrylic concentrator. Thus the refractive spectrum splitting photovoltaic concentrator system was found to have an overall relative efficiency advantage of 23% when compared with an ideal single cell concentrator.

The preferred embodiment of the present invention may be modified in a number of ways without departing from the object of the invention. The number, size, shape, relative position, and composition of the refracting elements and photovoltaic cells may be varied. Instead of a dispersed line focus, a dispersed point focus may be produced by adding a linear array of concentrating prisms oriented perpendicular to the first two prism arrays, or by replacing the linear array of concentrating prisms with an array of concentric curved prisms. Moreover, known techniques from the field of solar energy conversion may be applied in realizing the invention. For example, refracting or reflecting optical elements may be placed near the regions of focus to provide additional concentration, and photovoltaic cells may be stacked for additional spectrum splitting. Embodiments of the invention may include solar energy converters other than semiconductor photovoltaic cells that also benefit from spectrum splitting, such as photoelectrochemical cells, light antenna systems, and thermal cogeneration arrangements in which fluids are heated.

In addition to solar energy conversion, the present invention is of value for measurement of the spectral composition of collimated light by placing detection means at the regions of focus. Additionally, the present invention may be used for educational demonstrations or decorative display by making the regions of focus visible to an observer.

What is claimed:

1. A device for concentrating approximately collimated light having a broad photon energy spectrum onto regions of focus, comprising two pluralities of refracting elements arranged so a ray of said collimated light passes through one of said refracting elements in each of said pluralities and through a gap between said refracting elements, whereby said refracting elements act together to disperse and redirect said collimated light, whereby the area of said regions of focus exposed to the dispersed and redirected light is smaller than the area of said pluralities of refracting elements exposed to said collimated light, and whereby each of said regions of focus receives light having a photon energy spectrum that is narrower than said broad photon energy spectrum.

2. The device of claim 1, further including converters for changing the radiant energy of said dispersed and redirected light reaching at least one of said regions of focus to another form of energy, where said converters are selected from the group consisting of photovoltaic cells, photoelectrochemical cells, light antennae, and fluids, whereby said converters advantageously operate at a higher efficiency when exposed to the narrow photon energy spectrum than they would if exposed to said broad photon energy spectrum.

3. The device of claim 1, wherein the first plurality of refracting elements consists of an array of parallel coplanar prisms having triangular cross section whose apex angle, $\phi 1$, varies across said array, and wherein the second plurality of refracting elements consists of an array of parallel coplanar prisms having triangular cross section whose apex angle, φ2, varies across said array.

4. The device of claim 3, wherein the path of a ray passing through said refracting elements is described by the equations $$\theta_b = \sin^{-1}(\sin(\theta_a)/n)$$

$$\theta_c = \phi 1 - \sin^{-1}(n \sin(\phi 1 - \theta_b))$$

$$\theta_d = \sin^{-1}(\sin(\phi 2 + \theta_c)/n) - \phi 2$$

$$\theta_e = \sin^{-1}(n \sin \theta_d)$$

where n refers to the energy-dependent index of refraction of the material or materials comprising said refracting elements, where $\theta_i$ refers to the angle of the ray with respect to the normal to said pluralities of refracting elements, and where i refers to the medium through which said ray travels: a, the air or vacuum between the source of said collimated light and said first plurality of refracting elements; b, the medium of which said first plurality of refracting elements is made; c, air or vacuum between the two pluralities of refracting elements; d, the medium of which said second plurality of refracting elements is made; and e, the air or vacuum between said second plurality of refracting elements and said regions of focus.

5. The device of claim 4, wherein photons of a specific energy are directed to a line focus and regions of focus to one side of said line tend to receive photons with energy greater than said specific energy while regions of focus to the other side of said line tend to receive photons with energy less than said specific energy.

6. The device of claim 1, wherein said refracting elements are made of acrylic.

7. The device of claim 1, wherein said regions of focus lie in a plane.

8. The device of claim 2, wherein said converters comprise photovoltaic cells selected from the group consisting of germanium, silicon, cadmium selenide, and cadmium sulfide.

9. The device of claim 1, further including detection means for measuring the amount of light reaching at least one of said regions of focus, whereby the spectral content of said collimated light is analyzed.

10. The device of claim 1, wherein the regions of focus are visible to an observer, whereby the components of said broad photon energy spectrum are displayed for educational or aesthetic purposes.

* * * * *